United States Patent
Nieland

(10) Patent No.: US 9,225,303 B1
(45) Date of Patent: Dec. 29, 2015

(54) METHOD AND APPARATUS FOR CLASS AB AUDIO AMPLIFIER OUTPUT STAGE VOLTAGE PROTECTION

(71) Applicant: Nuvoton Technology Corporation, Hsinchu (TW)

(72) Inventor: Jan-Harm Nieland, Santa Clara, CA (US)

(73) Assignee: NUVOTON TECHNOLOGY CORPORATION, Hsin-chu (TW)

( * ) Notice: Subject to any disclaimer, the term of this patent is extended or adjusted under 35 U.S.C. 154(b) by 0 days.

(21) Appl. No.: 14/329,810

(22) Filed: Jul. 11, 2014

(51) Int. Cl.
*H03F 3/26* (2006.01)
*H03F 3/187* (2006.01)

(52) U.S. Cl.
CPC .................. *H03F 3/26* (2013.01); *H03F 3/187* (2013.01); *H03F 2200/03* (2013.01); *H03F 2200/219* (2013.01); *H03F 2200/426* (2013.01)

(58) Field of Classification Search
CPC ................................... H03F 3/26; H03F 3/265
USPC ................................................. 330/267, 264
See application file for complete search history.

(56) References Cited

U.S. PATENT DOCUMENTS

| | | | | |
|---|---|---|---|---|
| 3,887,878 A | * | 6/1975 | Schade, Jr. | 330/267 |
| 5,373,249 A | * | 12/1994 | Barrett et al. | 330/264 |
| 5,510,754 A | * | 4/1996 | Moraveji et al. | 330/267 |
| 8,497,736 B1 | * | 7/2013 | Leipold et al. | 330/267 |
| 2010/0098268 A1 | * | 4/2010 | Wong | 381/120 |

* cited by examiner

*Primary Examiner* — Henry Choe
(74) *Attorney, Agent, or Firm* — Kilpatrick Townsend and Stockton LLP

(57) ABSTRACT

An output circuit for a class AB push-pull amplifier includes an upper cascode output stage and a lower cascode output stage. The upper cascode stage includes first and second PMOS transistors connected in series between a positive power supply node and an output node, the first PMOS transistor configured to receive a first complementary input signal. The lower cascode output stage includes first and second NMOS transistors connected in series between a negative power supply node and the output node, the first NMOS transistor configured to receive a second complementary input signal. The output circuit also includes a bias circuit configured for providing a first bias voltage to a gate node of the second NMOS transistor and a second bias voltage to a gate node of the second PMOS transistor, in which the first and the second bias voltages being substantially proportional to the output voltage.

20 Claims, 7 Drawing Sheets

METHOD AND APPARATUS FOR CLASS AB AUDIO AMPLIFIER OUTPUT STAGE VOLTAGE PROTECTION

CROSS-REFERENCES TO RELATED APPLICATIONS

Not Applicable

BACKGROUND OF THE INVENTION

The present invention relates generally to CMOS integrated circuit techniques. More specifically, embodiments of the present invention provide methods and circuits for protecting amplifier output circuits.

Amplifier circuits are ubiquitous in modern electronic devices. An electronic amplifier increases the power and/or amplitude of a signal. In many applications, power amplifier circuits are used at the output stage of a system to drive an external device. Merely as an example, in an audio system, an output power amplifier is often used to drive an external speaker or headphone.

Power amplifier circuits output stages can be classified as class A, B, AB, and C, etc. for analog signal amplification. This classification is based on the portion of the input signal cycle during which the amplifying device conducts.

A Class A amplifier operates over the whole of the input cycle such that the output signal is a magnified replica of the whole input with no clipping. Class A amplifiers are the usual means of implementing small-signal amplifiers. In a Class A circuit, the amplifying device operated over the linear portion of its characteristic curve. Because the device is always conducting, even if there is no input at all, power is drawn from the power supply. Accordingly, class A amplifiers tend to be relatively inefficient, especially for large power devices.

In contrast, Class B amplifiers only amplify half of the input signal cycle. As such they tend to create signal distortion, but their efficiency is greatly improved over Class A amplifiers. This is because the amplifying element is switched off and does not dissipate power half of the time. An application using Class B amplifiers is the complementary pair or "push-pull" arrangement. Here, complementary devices are used to each amplify the opposite halves of the input signal. The amplified two halves are then recombined at the output. This arrangement gives improved efficiency, but can suffer from the drawback of mismatch at the "joints" between the two halves of the signal, also known as the crossover distortion. An improvement can be achieved by biasing the devices such that neither of the two devices is completely off when they're not in use. This mode of circuit operation is often called Class AB operation.

In Class AB operation, each device operates over half the wave similar to Class B operation, but each also conducts over a small signal range in the other half. As a result, when the waveforms from the two devices are combined, the crossover distortion is reduced. Here the two active elements conduct more than half of the time as a means to reduce the cross-over distortions of Class B amplifiers.

In certain applications, it may be desirable to use Class C amplifiers, which conduct less than 50% of the input signal and the distortion at the output is high, but high efficiencies are possible. An application for Class C amplifiers is in RF transmitters.

An audio amplifier is an electronic amplifier that amplifies low-power audio signals to drive loudspeakers. Audio signals generally have frequencies between 20 Hertz to 20,000 Hertz, which is the human range of hearing. In a typical audio system, the audio amplifier is usually preceded by low power audio amplifiers which perform tasks like pre-amplification, equalization, tone control, mixing/effects, or audio sources like record players, CD players, and mp3 streams. Audio systems are used in public address systems, theatrical and concert sound reinforcement, and home sound systems, and mobile phones and tablets etc. The sound card in a personal computer often contains several audio amplifiers, as does every stereo or home-theatre system. Audio amplifiers often need to meet stringent performance requirement. In some applications, the input signal to an audio amplifier may measure only a few hundred microwatts. However, its output power may be tens or hundreds of watts.

Because of these requirements, Class AB push-pull circuits are a popular design choice in audio power amplifiers. Even though audio amplifier circuits are widely used in many applications, certain limitations still exist. Some examples are discussed below. FIG. 1A is a simplified view diagram illustrating an output portion 100 of a conventional audio system. As shown in FIG. 1A, an audio frequency signal 102 entering an amplifier 104, which amplifies the signal and drives a speaker 108. A schematic diagram of 100 is shown in FIG. 1B, where the amplifier is shown as a preamplifier 105 and a CMOS output driver circuit 106 including a PMOS driver device and an NMOS driver device. The speaker 108 is shown as an equivalent 8 ohm resistance load.

In some class AB amplifiers, a cascode output stage is used. A cascode amplifier usually has a common source amplifier as input stage driven by signal source. This input stage drives a common gate amplifier as output stage. The cascode configuration would offer a potentially greater gain and much greater bandwidth. It also enables the use of low voltage devices in the higher voltage circuit. This is the main reason to use a cascode in an output stage.

FIG. 2 is a circuit diagram of a conventional output circuit for a push-pull class AB cascode amplifier. As shown in FIG. 2, output circuit 200 includes first power node 201 for coupling to a positive power supply V0, second power node 202 for coupling to a negative power supply V1, and an output node 205. Output circuit 200 also includes first PMOS transistor P1 and second PMOS transistor P2 connected in series between positive power supply node 201 and output node 205. The drain node of P1 and the source node of P2 are connected at node 207. Output circuit 200 further includes first and second NMOS transistors N1 and N2 connected in series between output node 205 and negative power supply node 202. The drain node of N1 and the source node of N2 are connected at node 208. A first input node In1 is coupled to a gate of the first PMOS transistor P1. A second input node In2 is coupled to a gate of the first NMOS transistor N1. In FIG. 2, positive power supply V0 and negative power supply V1 are connected to a ground terminal GND. It can be seen in FIG. 2 that the gate of PMOS transistor P2 and the gate of NMOS transistor N2 are both biased at a ground voltage GND.

BRIEF SUMMARY OF THE INVENTION

The inventor has observed that conventional cascode amplifiers suffer from various limitations. For example, conventional cascode devices are often biased with a constant voltage, halfway the supply voltage (or ground). These cascode devices may be adequate for quiescent operation and small output signals. However, this configuration can only handle large signals if the devices have a higher breakdown voltage than half the maximum voltage swing. This is undesirable because devices with higher breakdown voltages often require more complicated processes and higher cost. Therefore, cascode amplifier designs that use devices having low breakdown voltages, but allow large operating voltage range are highly desirable.

Embodiments of the invention provide a method to protect the output devices of a class AB output stage by providing bias voltages for the cascode transistors that depend on the output voltage. According to embodiments of the present invention, an output circuit for an amplifier includes a first power node for coupling to a positive power supply, a second power node for coupling to a negative power supply, and an output node. The output circuit also includes first and second PMOS transistors connected in series between the first power node and the output node, and first and second NMOS transistors connected in series between the output node and the second power node. The output circuit also includes a first input terminal coupled to a gate of the first PMOS transistor and a second input terminal coupled to a gate of the first NMOS transistor. Moreover, the output circuit includes a voltage divider coupled between the output node and a ground node GND, the voltage divider including first and second resistors which are connected at a first node. The output circuit also include two source followers. A first source follower includes a third PMOS transistor, which has a gate coupled to the first node and a source coupled to a gate of the second NMOS transistor. A second source follower includes a third NMOS transistor, which has a gate coupled to the first node and a source coupled to a gate of the second PMOS transistor.

In an embodiment of the above output circuit, the first PMOS transistor is configured to receive a first input signal, and the first NMOS transistor is configured to receive a second input signal.

In an embodiment, a bias voltage at the gate of the second NMOS transistor is configured to follow a voltage at the output node.

In an embodiment, a drain voltage of the first NMOS transistor is determined by the resistance values of the first and the second resistors and the threshold voltages of the third PMOS transistor and the second NMOS transistor.

In an embodiment, the first NMOS transistor is characterized by a drain-to-source voltage that is below a first voltage limit during operation.

In an embodiment, a bias voltage at the gate of the second PMOS transistor is configured to follow a voltage at the output node.

In an embodiment, a drain voltage of the first PMOS transistor is determined by the resistance values of the first and the second resistors and the threshold voltages of the third NMOS transistor and the second PMOS transistor.

In an embodiment, the first PMOS transistor is characterized by a drain-to-source voltage that is below a second voltage limit during operation.

In an embodiment, a bias voltage at the gate of the second NMOS transistor is configured to follow a voltage at the output node.

According to alternative embodiments of the present invention, an output circuit for a class AB push-pull amplifier includes an upper cascode output stage including first and second PMOS transistors connected in series between a positive power supply node and an output node, in which the first PMOS transistor is configured to receive a first complementary input signal. The output circuit also has a lower cascode output stage including first and second NMOS transistors connected in series between a negative power supply node and the output node, in which the first NMOS transistor is configured to receive a second complementary input signal. The output circuit also has a bias circuit, which includes a voltage divider and two source followers. The voltage divider is coupled to the output node configured for providing a first voltage signal that is related to the voltage at the output node. A first source follower is coupled to receive the first voltage signal and is configured for providing a first bias voltage to a gate node of the second NMOS transistor in the lower cascode output stage. A second source follower is coupled to receive the first voltage signal and is configured for providing a second bias voltage to a gate node of the second PMOS transistor in the upper cascode output stage.

In an embodiment of the above output circuit, the first source follower includes a third PMOS transistor, the third PMOS transistor having a gate coupled to a first node of the voltage divider and a source coupled to a gate of the second NMOS transistor.

In an embodiment, the second source follower includes a third NMOS transistor, the third NMOS transistor having a gate coupled to a first node of the voltage divider and a source coupled to a gate of the second PMOS transistor.

In an embodiment, the first NMOS transistor is characterized by a drain-to-source voltage that is below a first voltage limit during operation.

In an embodiment, the first PMOS transistor is characterized by a drain-to-source voltage that is below a second voltage limit during operation.

According to alternative embodiments of the present invention, an output circuit for a class AB push-pull amplifier includes an upper cascode output stage and a lower cascode output stage. The upper cascode output stage includes first and second PMOS transistors connected in series between a positive power supply node and an output node, the first PMOS transistor configured to receive a first complementary input signal. The lower cascode output stage includes first and second NMOS transistors connected in series between a negative power supply node and the output node, the first NMOS transistor configured to receive a second complementary input signal. The output circuit also includes a bias circuit configured for providing a first bias voltage to a gate node of the second NMOS transistor and a second bias voltage to a gate node of the second PMOS transistor, in which the first and the second bias voltages being substantially proportional to the output voltage.

In an embodiment of the above output circuit, the bias circuit includes a voltage divider coupled to the output node configured for providing a first voltage signal that is proportional to the voltage at the output node. The bias circuit also includes a first source follower coupled to receive the first voltage signal and configured for providing the first bias voltage to the gate node of the second NMOS transistor. The bias circuit also has a second source follower coupled to receive the first voltage signal and configured for providing the second bias voltage to the gate node of the second PMOS transistor.

In an embodiment, the first source follower includes a third PMOS transistor, which has a gate coupled to a first node of the voltage divider and a source coupled to a gate of the second NMOS transistor.

In an embodiment, the second source follower includes a third NMOS transistor, the third NMOS transistor having a gate coupled to a first node of the voltage divider and a source coupled to a gate of the second PMOS transistor.

In an embodiment, the first NMOS transistor is characterized by a drain-to-source voltage that is below a first voltage limit during operation.

In an embodiment, the first PMOS transistor is characterized by a drain-to-source voltage that is below a second voltage limit during operation.

A further understanding of the nature and advantages of the present invention may be realized by reference to the remaining portions of the specification and the drawings.

DETAILED DESCRIPTION OF THE INVENTION

Figure 1A:
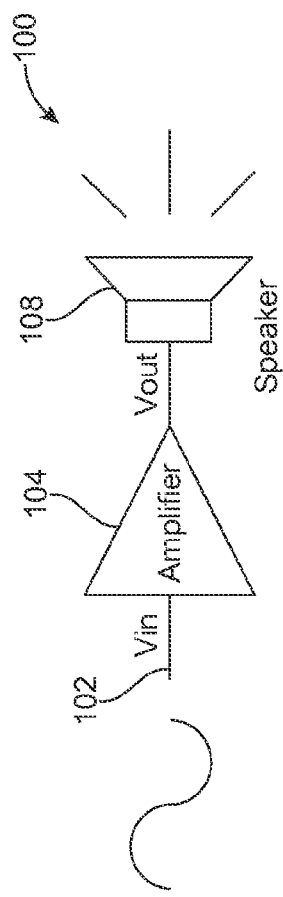
FIG. 1A is a schematic diagram of an output portion of a conventional audio system.
Figure 1B:
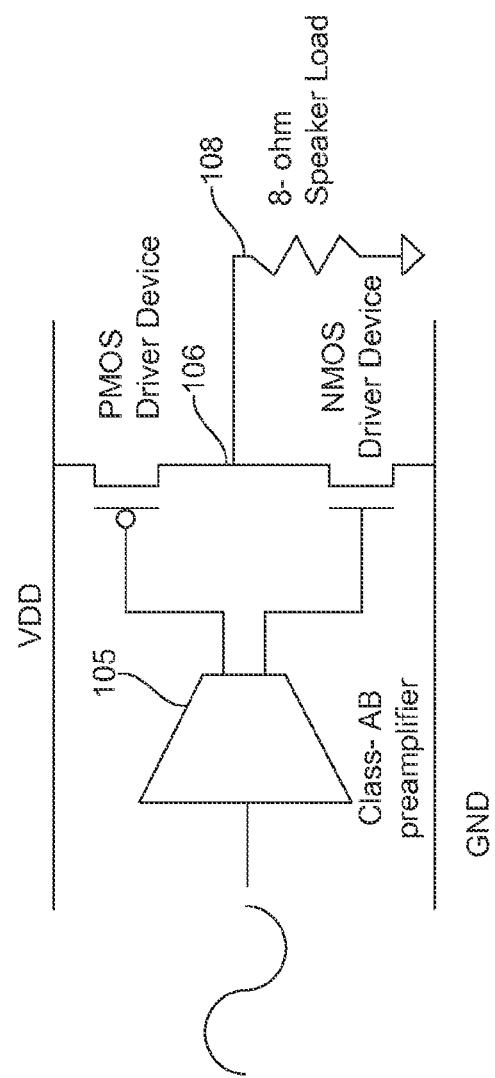
FIG. 1B is a schematic diagram of an output portion of another conventional audio system.
Figure 2:
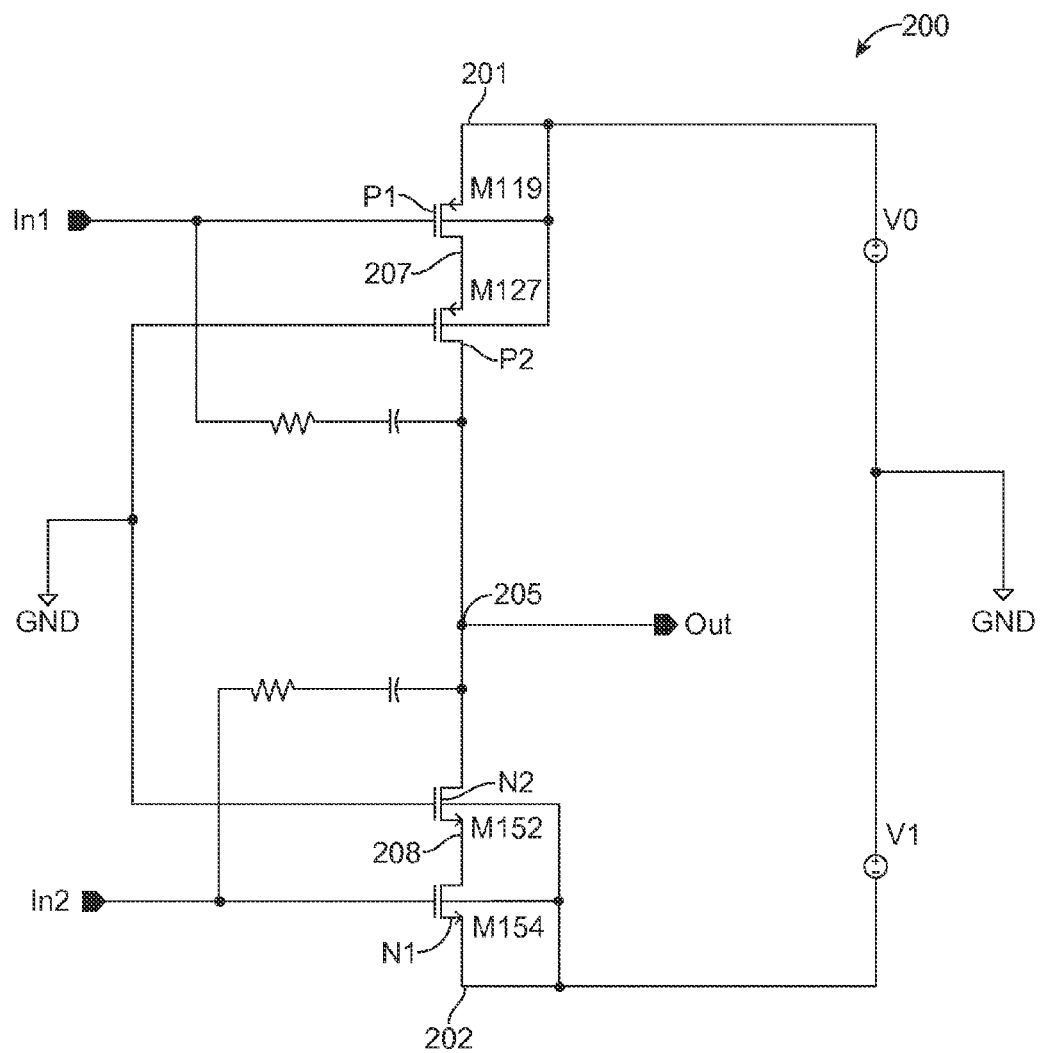
FIG. 2 is a circuit diagram of a conventional output circuit for a cascoded push-pull class AB amplifier.

In an audio system with a charge pump to generate a negative supply voltage, the amplifiers to drive the output such as the line out, the headphone, or an earpiece, voltages across output transistors can become higher than their breakdown voltages. Stacking (also called cascoding) devices helps to make the circuits more robust. As illustrated in FIG. 2 and described above, conventional cascode devices are often biased with a constant voltage, halfway the supply voltage (or ground). This design may be adequate for quiescent operation and small output signals. However, as described below, with large signals, the voltage across the devices can be higher than the breakdown voltage limit of the transistors, thus requiring more costly devices with higher breakdown voltages.

Figure 3:
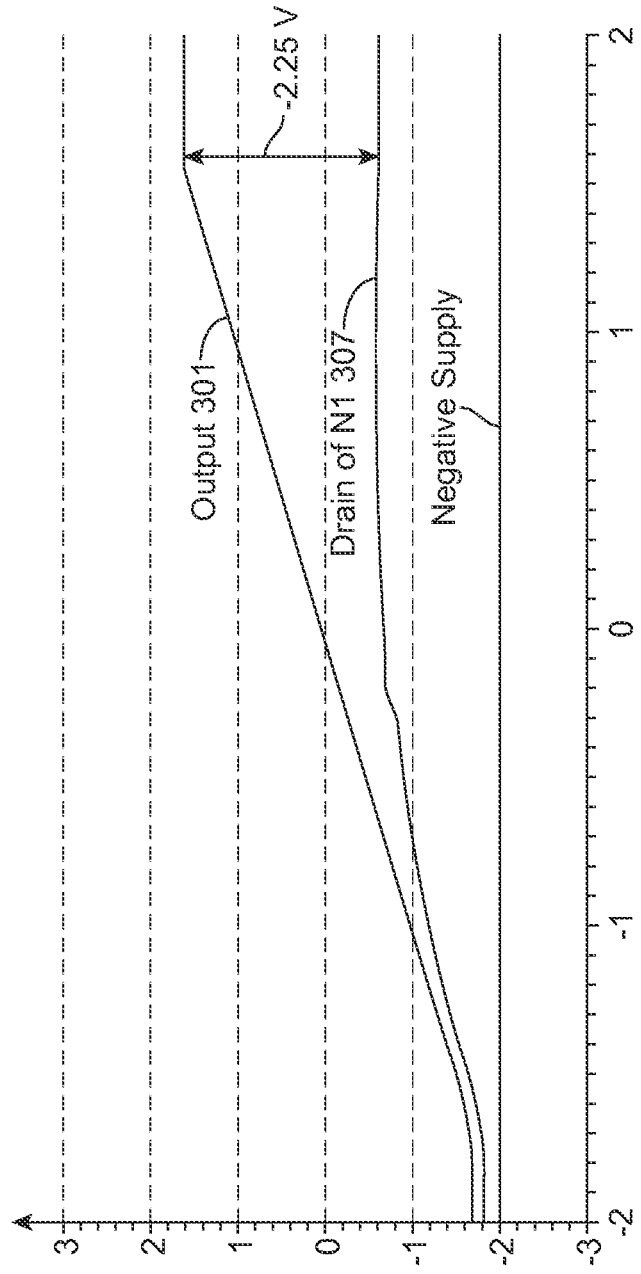
FIG. 3 is a diagram illustrating voltages at various circuit nodes in the output circuit in FIG. 2.

FIG. 3 is a diagram illustrating the voltages at various circuit nodes in the output circuit in FIG. 2. In FIG. 3, the vertical axis shows the magnitude of the voltages at various circuit nodes, and the horizontal axis shows the input voltage in the output circuit in FIG. 2. In this example, the positive supply voltage can be as high as 2V, and the negative supply voltage as low as −2V. FIG. 3 shows the voltages in the circuit when the input of the amplifier is changed from −2 to 2V, with amplifier gain is set to 1. In this example, the transistors have a source-drain voltage limit of 2V. Curve 301 shows the voltage at the output node 205 in FIG. 2, which, in principle, can vary between −2V and 2V. Curve 307 represents the voltage at the drain node 208 of NMOS transistor N1, which is also the voltage at the source node of NMOS transistor N2. It can be seen that the source-drain voltage drop of NMOS transistor N2 can be as high as 2.25V, exceeding the desired specification of the source-drain voltage of 2V.

Figure 4:
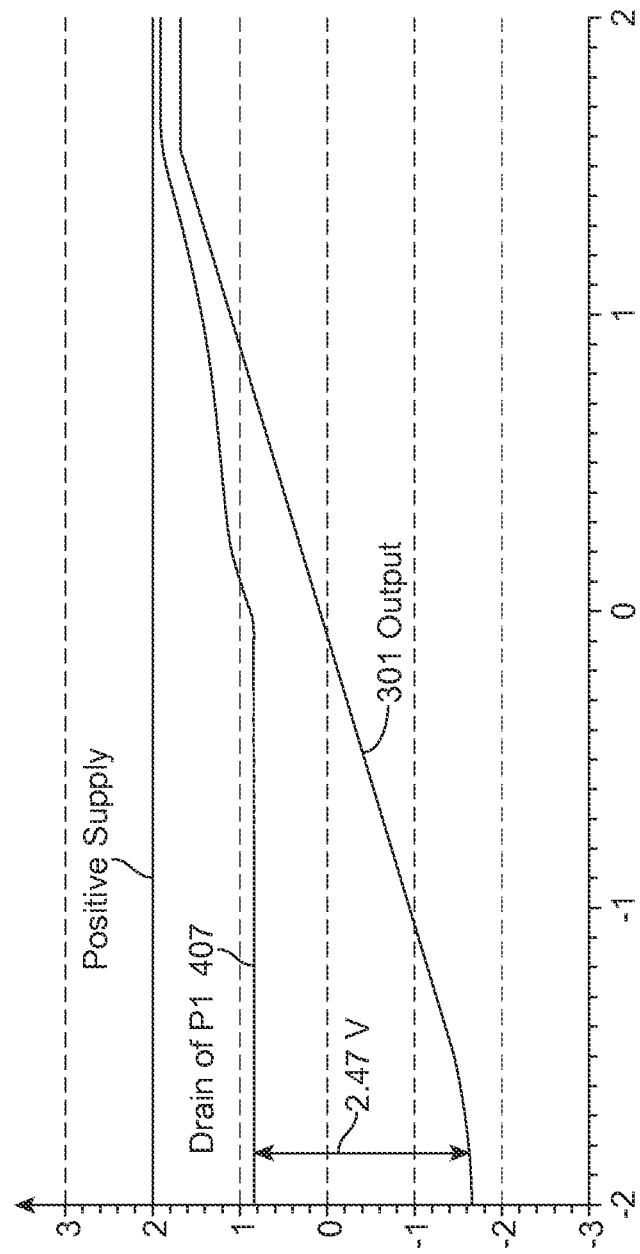
FIG. 4 is another diagram illustrating voltages at various circuit nodes in the output circuit in FIG. 2.

FIG. 4 is another diagram plotting the voltages at various circuit nodes of FIG. 2 as the output voltage varies. FIG. 4 is similar to FIG. 3 described above, but with the focus on the PMOS cascode transistors P1 and P2 in FIG. 2. In FIG. 4, the vertical axis shows the magnitude of the voltages at various circuit nodes, and the horizontal axis shows the input voltage in the output circuit in FIG. 2 with the gain of the class AB amplifier set to 1. Curve 301 shows the voltage at the output node 205, which, in principle, can vary between −2V and 2V.

Curve 407 represents the voltage at the drain node 207 of PMOS transistor P1, which is also the voltage at the source node of PMOS transistor P2. It can be seen that the source-drain voltage drop of PMOS transistor P2 can be as high as 2.47V, exceeding the desired specification of the source-drain voltage of 2V.

It can be seen that in the conventional output circuit, the source-to-drain voltages of the cascode transistors often cannot be maintained within the device specification of the transistors. Embodiments of the invention provide a method to protect the output devices of a class AB output stage by providing bias voltages for the cascode transistors that depend on the output voltage such that the voltage across the cascode transistors remain within the voltage specification during operation. In an embodiment, the bias circuit includes a voltage divider connected to the output of the amplifier and two source followers that are connected between the voltage divider and the two cascode transistors. An example is described below.

Figure 5:
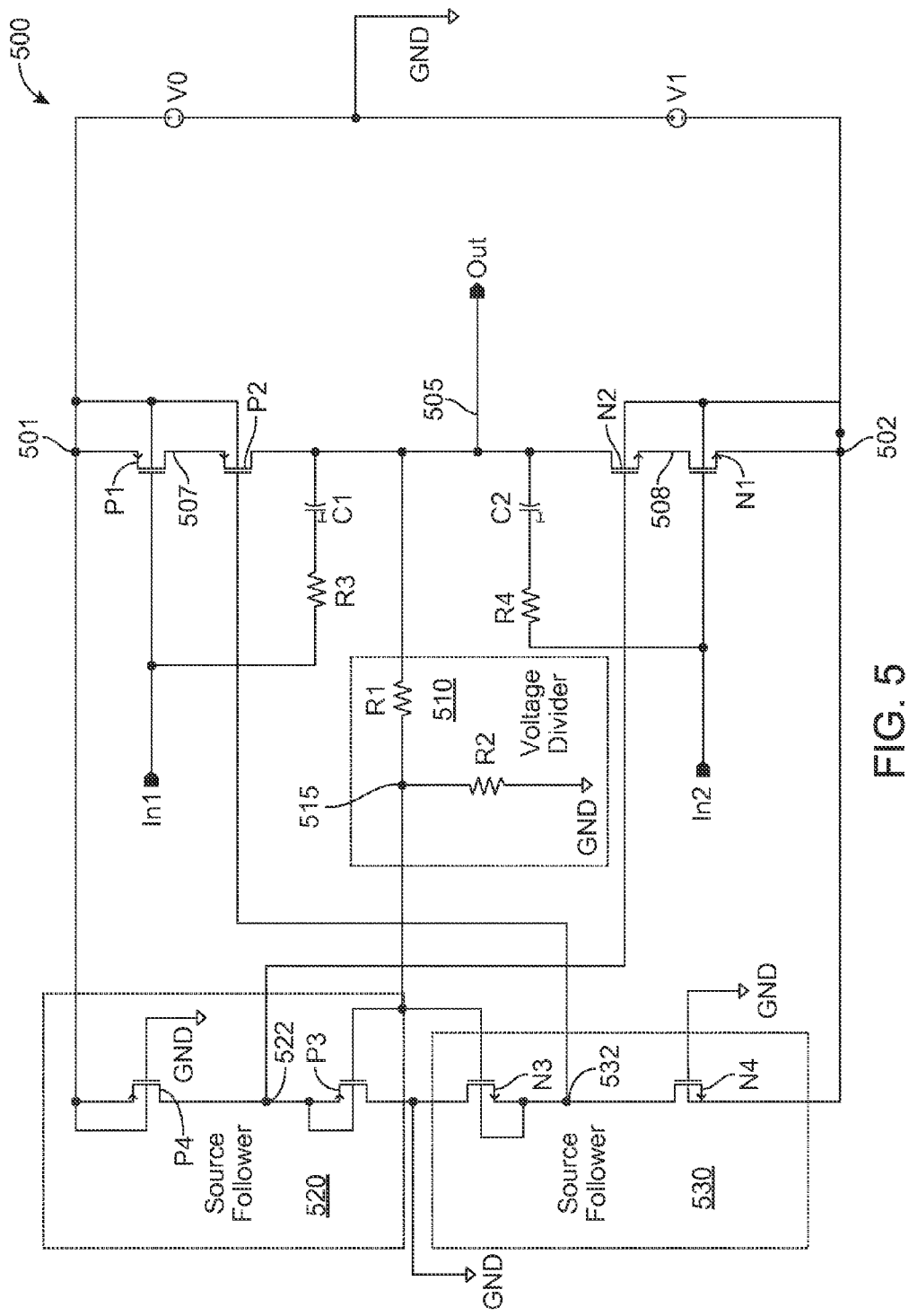
FIG. 5 is a circuit diagram of an output circuit according to an embodiment of the present invention.

FIG. 5 is a circuit diagram of an output circuit according to an embodiment of the present invention. As shown in FIG. 5, output circuit 500 includes first power node 501 for coupling to a positive power supply V0, second power node 502 for coupling to a negative power supply V1, and an output node 505. Output circuit 500 also includes first PMOS transistor P1 and second PMOS transistor P2 connected in series between positive power supply node 501 and output node 505. The drain node of P1 and the source node of P2 are connected at node 507. Output circuit 500 further includes first and second NMOS transistors N1 and N2 connected in series between output node 505 and negative power supply node 502. The drain node of N1 and the source node of N2 are connected at node 508. A first input node In1 is coupled to a gate of the first PMOS transistor P1. A second input node In2 is coupled to a gate of the first NMOS transistor N1. A voltage divider 510 is coupled to output node 505 and includes first resistor R1 and second resistor R2. The first and the second resistors R1 and R2 are connected at a first internal divider node 515. Output circuit 500 also includes a first source follower 520, which includes a third PMOS transistor P3 having a gate coupled to the first internal divider node 515 and a source node 522 coupled to a gate of the second NMOS transistor N2 for providing a bias. Output circuit 500 also includes a second source follower 530, which includes a third NMOS transistor N3 having a gate coupled to the first internal divider node 515 and a source node 532 coupled to a gate of the second PMOS transistor P2 for providing a bias.

As shown in FIG. 5, the substrate nodes of PMOS transistors P1 and P2 are coupled to positive power node 501. The substrate nodes of NMOS transistors N1 and N2 are coupled to negative power node 502. Source follower PMOS transistor P3 has a substrate node coupled to its source node. Similarly, source follower NMOS transistor N3 has a substrate node coupled to its source node. In FIG. 5, input node In1 is coupled to output node 505 through serially connected resistor R3 and capacitor C1. Similarly, input node In2 is coupled to output node 505 through serially connected resistor R4 and capacitor C2.

In FIG. 5, positive power supply V0 is connected between positive power node 501 and a ground node GND, and negative power supply V1 is connected between ground terminal GND and negative power node 502. Source follower 520 also includes a load device PMOS transistor P4 coupled to PMOS transistor P3. PMOS transistor P4 has a gate connected to GND, and a source and a substrate connected to positive power node 501. Source follower 530 also includes a load device NMOS transistor N4 coupled to NMOS transistor N3.

NMOS transistor P4 has a gate connected to GND, and a source and a substrate connected to negative power node 502.

In an embodiment, output circuit 500 in FIG. 5 can be used as an output device for a class AB amplifier. Input nodes In1 and In2 are configured to receive input signals, e.g., audio input signals, and provide the input signals to cascode output transistors P1, P2, N1, and N2. As shown in FIG. 5, the bias voltages of transistors P2 and N2 are derived from a bias circuit and are dependent on the output voltage at output node 505. The bias circuit includes voltage divider 510 connected to the output of the amplifier, and two source followers 520 and 530 that are connected between the voltage divider and the two cascode transistors P2 and N2. Here, the voltage divider allows for a fraction on of the output voltage to be used as the bias voltage. In addition, the source followers can provide isolation in the bias circuit.

In some embodiments, the drain nodes of transistors P3 and N3 are coupled to GND to provide higher gate-source voltage Vgs at cascode transistors N2 and P2. In other embodiments, the drain nodes of transistors P3 and N3 are not necessarily coupled to GND.

Figure 6:
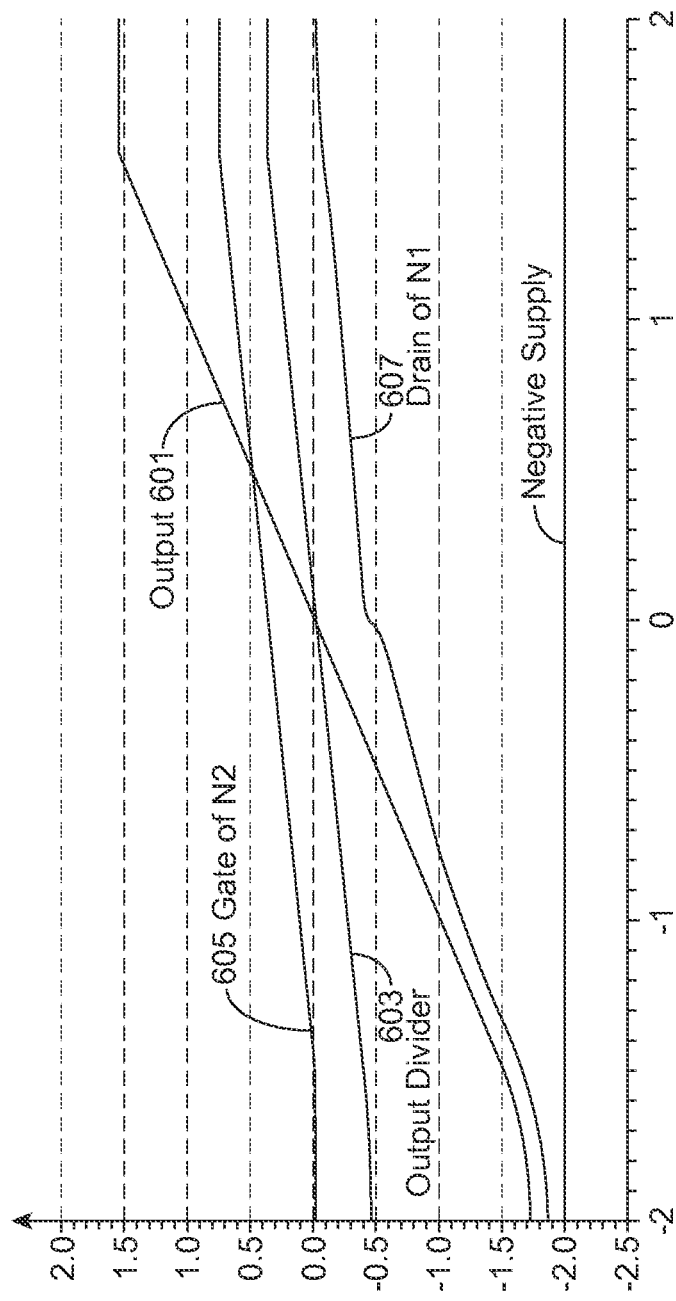
FIG. 6 is a diagram illustrating voltages at various circuit nodes in the output circuit in FIG. 5 according to an embodiment of the present invention.

FIG. 6 is a diagram illustrating the voltages at various circuit nodes in the output circuit in FIG. 5 according to an embodiment of the present invention. In FIG. 6, the vertical axis shows the magnitude of the voltages at various circuit nodes, and the horizontal axis shows the input voltage in the output circuit in FIG. 5, with the gain of the class AB amplifier set at 1. In this example, the positive supply voltage can be as high as 2V, and the negative supply voltage as low as −2V. In this embodiment, the transistors have a source-drain voltage limit of 2V. Curve 601 shows the voltage at the output node 505, which can vary between −2V and 2V. In this embodiment, however, a clamping circuit, not shown in FIG. 5, prevents the output voltage from reaching the limits of 2V and −2V at the far ends of the graph. In FIG. 5, curve 603 shows the voltage at the first internal divider node 515 of the voltage divider which, through voltage divider resistors R1 and R2, follows curve 601, the voltage at the output node 505. Curve 605 shows the gate voltage of NMOS transistor N2 in FIG. 5. It can be seen that the gate bias voltage 605 at cascode transistor N2 follows the voltage at the first internal divider node 515 of the voltage divider, which in turn follows curve 601, the voltage at the output node. Curve 607 represents the voltage at the drain node 508 of NMOS transistor N1, which is also the voltage at the source node of NMOS transistor N2. It can be seen that the drain node 508 of NMOS transistor N1 is kept below 0V. As a result, drain voltage of NMOS transistor N1 is kept between −2V and 0V. Accordingly, the source-drain voltage drop of NMOS transistor N1 is kept no more than 2V, meeting the desired specification of the source-drain voltage of 2V. Moreover, the source-drain voltage drop of NMOS transistor N2, which is the voltage between curves 601 and 607, is also kept within 2V.

With reference to the circuit diagram of FIG. 5 and the voltage diagrams in FIG. 6, it can be seen that the drain voltage 607 of NMOS transistor N1 is the same as the source voltage of NMOS transistor N2, which is below the gate voltage of transistor N2 by the gate-source voltage of transistor N2. From FIG. 5, it can be seen that the gate bias of transistor N2 is derived from the first internal divider node 515 of voltage divider 410 by a difference of the gate-source voltage of source follower PMOS transistor P3. The gate-source voltage of a transistor in turn is related to its threshold voltage, and the voltage at the first internal divider node 515 is derived from the output voltage at output node 505 through voltage divider 510. Therefore, in embodiments of the present invention, the drain voltage of cascode NMOS transistor N2 can be determined by the voltage divider resistors R1 and R2, and the threshold voltages of NMOS cascode transistor N2 and PMOS source follower transistor P3. By selecting appropriate values for the resistances of resistors R1 and R2, and the threshold voltages for transistors N2 and P3, the voltage drop across the drain-source nodes of transistors N1 and N2 can be maintained within a desired voltage specification. Further, using a source follower in the bias circuit can serve to isolate the gate bias of the cascode transistor from the output node.

It is also noted that in FIG. 6 that curve 605, representing the gate voltage of NMOS transistor N2, doesn't go below the ground voltage. With a resistive load, NMOS transistors N1 and N2 will have to sink a large current when the output voltage is close to the negative supply rail. The on resistance of N2 should be as small as possible. Therefore, the gate voltage of N2 is clamped to ground, and does not follow the output voltage 601 to the negative voltage range.

Figure 7:
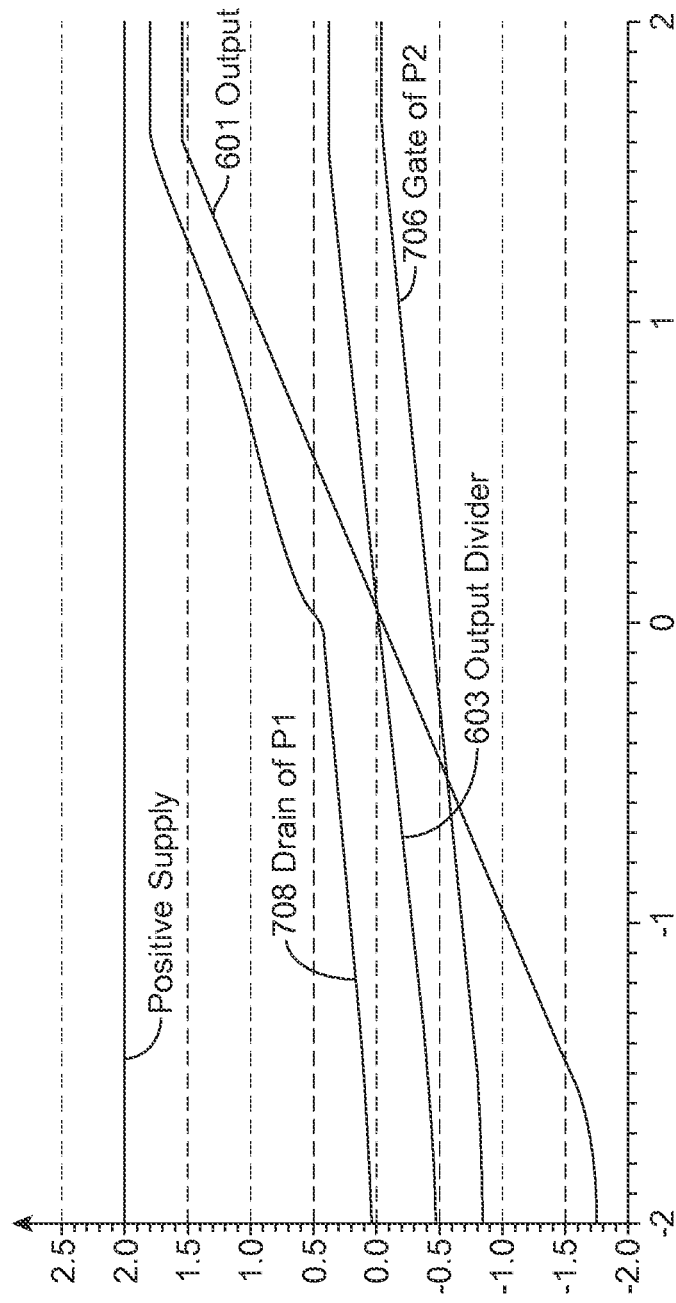
FIG. 7 is another diagram plotting voltages at various circuit nodes of FIG. 5 as the output voltage varies according to an embodiment of the present invention.

FIG. 7 is another diagram illustrating the voltages at various circuit nodes of FIG. 5 as the output voltage varies according to an embodiment of the present invention. FIG. 7 is similar to FIG. 6 described above, but with the focus on the PMOS cascode transistors P1 and P2. In FIG. 7, the vertical axis shows the magnitude of the various voltages, and the horizontal axis shows the input voltage in the output circuit in FIG. 5, with the gain of the class AB amplifier set at 1. Again, the positive supply voltage is 2V, and the negative supply voltage is −2V. The transistors have a source-drain voltage limit of 2V. Similar to those shown in FIG. 6, curve 601 shows the voltage at the output node 505, and curve 603 shows the voltage at the internal node 515 of the voltage divider, which follows curve 601, the voltage at the output node. In FIG. 7, curve 706 shows the gate bias voltage of PMOS transistor P2 in FIG. 5. It can be seen that the gate bias voltage at cascode transistor P2 follows the voltage at the internal node 515 of the voltage divider, which in turn follows curve 601, the voltage at the output node 505. In FIG. 7, curve 708 represents the voltage at the drain node of PMOS transistor P1, which is also the voltage at the source node of PMOS transistor P2. It can be seen that the drain node 507 of PMOS transistor P1 is kept above 0V. As a result, drain voltage of PMOS transistor P1 is kept between −2V and 0V. Accordingly, the source-drain voltage drop of PMOS transistor P1 is kept no more than 2V, meeting the desired specification of the source-drain voltage of 2V. Moreover, the source-drain voltage drop of PMOS transistor P2, which is the voltage between curves 601 and 708, is also kept within 2V.

It is also noted that in FIG. 7 that curve 706, representing the gate voltage of PMOS transistor P2, does not go above the ground voltage. With a resistive load, PMOS transistors P1 and P2 will have to source a large current when the output voltage is close to the positive supply rail. The on resistance of P2 should be as small as possible. Therefore, the gate voltage of P2 is clamped to ground, and does not follow the output voltage 601 to the high voltage range.

Similar to the description above in connection with FIG. 5, by selecting appropriate values for the resistances of resistors R1 and R2, and the threshold voltages for cascode transistors P2 and source follower transistor N3, the voltage drop across the drain-source nodes of transistor P1 can be maintained within a desired voltage specification.

Thus, embodiments of the invention provide a method for protecting the output devices of a class AB output stage by providing bias voltages for the cascode transistors that depend on the output voltage. In an embodiment, the bias circuit includes a voltage divider connected to the output of the amplifier and two source followers that are connected between the voltage divider and the two cascode transistors.

Various embodiments of the present invention are described above. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An output circuit for an amplifier, comprising:
    a first power node for coupling to a positive power supply;
    a second power node for coupling to a negative power supply;
    an output node;
    first and second PMOS transistors connected in series between the first power node and the output node;
    first and second NMOS transistors connected in series between the output node and the second power node;
    a first input terminal coupled to a gate of the first PMOS transistor;
    a second input terminal coupled to a gate of the first NMOS transistor;
    a voltage divider coupled between the output node and a ground node GND, the voltage divider including first and second resistors which are connected at a first node;
    a first source follower including a third PMOS transistor, the third PMOS transistor having a gate coupled to the first node and a source coupled to a gate of the second NMOS transistor; and
    a second source follower including a third NMOS transistor, the third NMOS transistor having a gate coupled to the first node and a source coupled to a gate of the second PMOS transistor.

2. The circuit of claim 1, wherein the first PMOS transistor is configured to receive a first input signal, and the first NMOS transistor is configured to receive a second input signal.

3. The circuit of claim 1, wherein a bias voltage at the gate of the second NMOS transistor is configured to follow a voltage at the output node.

4. The circuit of claim 3, wherein a drain voltage of the first NMOS transistor is determined by the resistance values of the first and the second resistors and the threshold voltages of the third PMOS transistor and the second NMOS transistor.

5. The circuit of claim 3, wherein the first NMOS transistor is characterized by a drain-to-source voltage that is below a first voltage limit during operation.

6. The circuit of claim 1, wherein a bias voltage at the gate of the second PMOS transistor is configured to follow a voltage at the output node.

7. The circuit of claim 6, wherein a drain voltage of the first PMOS transistor is determined by the resistance values of the first and the second resistors and the threshold voltages of the third NMOS transistor and the second PMOS transistor.

8. The circuit of claim 6, wherein the first PMOS transistor is characterized by a drain-to-source voltage that is below a second voltage limit during operation.

9. The circuit of claim 6, wherein a bias voltage at the gate of the second NMOS transistor is configured to follow a voltage at the output node.

10. An output circuit for a class AB push-pull amplifier, comprising:
    an upper cascode output stage including first and second PMOS transistors connected in series between a positive power supply node and an output node, the first PMOS transistor configured to receive a first complementary input signal;
    a lower cascode output stage including first and second NMOS transistors connected in series between a negative power supply node and the output node, the first NMOS transistor configured to receive a second complementary input signal; and
    a bias circuit, including:
        a voltage divider coupled to the output node configured for providing a first voltage signal that is related to the voltage at the output node;
        a first source follower coupled to receive the first voltage signal and configured for providing a first bias voltage to a gate node of the second NMOS transistor in the lower cascode output stage; and
        a second source follower coupled to receive the first voltage signal and configured for providing a second bias voltage to a gate node of the second PMOS transistor in the upper cascode output stage.

11. The output circuit of claim 10, wherein the first source follower comprises a third PMOS transistor, the third PMOS transistor having a gate coupled to a first node of the voltage divider and a source coupled to a gate of the second NMOS transistor.

12. The output circuit of claim 10, wherein the second source follower comprises a third NMOS transistor, the third NMOS transistor having a gate coupled to a first node of the voltage divider and a source coupled to a gate of the second PMOS transistor.

13. The output circuit of claim 10, wherein the first NMOS transistor is characterized by a drain-to-source voltage that is below a first voltage limit during operation.

14. The output circuit of claim 10, wherein the first PMOS transistor is characterized by a drain-to-source voltage that is below a second voltage limit during operation.

15. An output circuit for a class AB push-pull amplifier, comprising:
    an upper cascode output stage including first and second PMOS transistors connected in series between a positive power supply node and an output node, the first PMOS transistor configured to receive a first complementary input signal;
    a lower cascode output stage including first and second NMOS transistors connected in series between a negative power supply node and the output node, the first NMOS transistor configured to receive a second complementary input signal; and
    a bias circuit configured for providing a first bias voltage to a gate node of the second NMOS transistor and a second bias voltage to a gate node of the second PMOS transistor, the first and the second bias voltages being substantially proportional to the output voltage.

16. The output circuit of claim 15, wherein the bias circuit comprises:
    a voltage divider coupled to the output node configured for providing a first voltage signal that is proportional to the voltage at the output node;
    a first source follower coupled to receive the first voltage signal and configured for providing the first bias voltage to the gate node of the second NMOS transistor; and
    a second source follower coupled to receive the first voltage signal and configured for providing the second bias voltage to the gate node of the second PMOS transistor.

17. The output circuit of claim 16, wherein the first source follower comprises a third PMOS transistor, the third PMOS transistor having a gate coupled to a first node and a source coupled to a gate of the second NMOS transistor.

18. The output circuit of claim 16, wherein the second source follower comprises a third NMOS transistor, the third NMOS transistor having a gate coupled to a first node and a source coupled to a gate of the second PMOS transistor.

19. The output circuit of claim 15, wherein the first NMOS transistor is characterized by a drain-to-source voltage that is below a first voltage limit during operation.

20. The output circuit of claim 15, wherein the first PMOS transistor is characterized by a drain-to-source voltage that is below a second voltage limit during operation.

* * * * *